(12) United States Patent
Reefman et al.

(10) Patent No.: US 7,345,606 B2
(45) Date of Patent: Mar. 18, 2008

(54) DA-CONVERTER SYSTEM AND A METHOD FOR CONVERTING A MULTI-BIT DIGITAL SIGNAL TO AN ANALOG SIGNAL

(75) Inventors: Derk Reefman, Eindhoven (NL); Adrianus Johannes Maria Van Tuijl, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/588,115

(22) PCT Filed: Jan. 18, 2005

(86) PCT No.: PCT/IB2005/050205

§ 371 (c)(1),
(2), (4) Date: Jul. 27, 2006

(87) PCT Pub. No.: WO2005/074139

PCT Pub. Date: Aug. 11, 2005

(65) Prior Publication Data

US 2007/0152859 A1    Jul. 5, 2007

(30) Foreign Application Priority Data

Jan. 28, 2004  (EP)  .................. 04100305

(51) Int. Cl.
*H03M 3/00*    (2006.01)
(52) U.S. Cl. ...................... 341/143; 341/144
(58) Field of Classification Search ................ 341/143, 341/144

See application file for complete search history.

(56) References Cited

U.S. PATENT DOCUMENTS 4,859,883 A    8/1989    Bradinal et al.

(Continued)

FOREIGN PATENT DOCUMENTS

DE    101 62 566    8/2003

(Continued)

OTHER PUBLICATIONS

Xu X et al: "The Implementation of Dual-Truncation Sigma Delta D/A Converters"; Proceedings of the International Symposium on Circuits and Systems; San Diego; May 10-13, 1992; Proceedings of the International Symposium on Circuits and Systems; N.Y. IEEE vol. 4 Conf. 25; May 3, 1992.

(Continued)

*Primary Examiner*—Linh Nguyen
(74) *Attorney, Agent, or Firm*—Peter Zawilski

(57) ABSTRACT

Consistent with an example embodiment a, DA-converter system comprises the cascade of a multi-bit sigma-delta modulator and a DA-converter. The quantization noise of the sigma-delta modulator is isolated; the isolated quantization noise is word-length reduced in a second noise shaper with frequency independent signal transfer function and the isolated word-length reduced quantization noise is subtracted from the quantization noise of said cascade. In another embodiment, the isolated quantization noise is amplified before and attenuated after the second noise shaper.

8 Claims, 2 Drawing Sheets

U.S. PATENT DOCUMENTS

Figure 1:
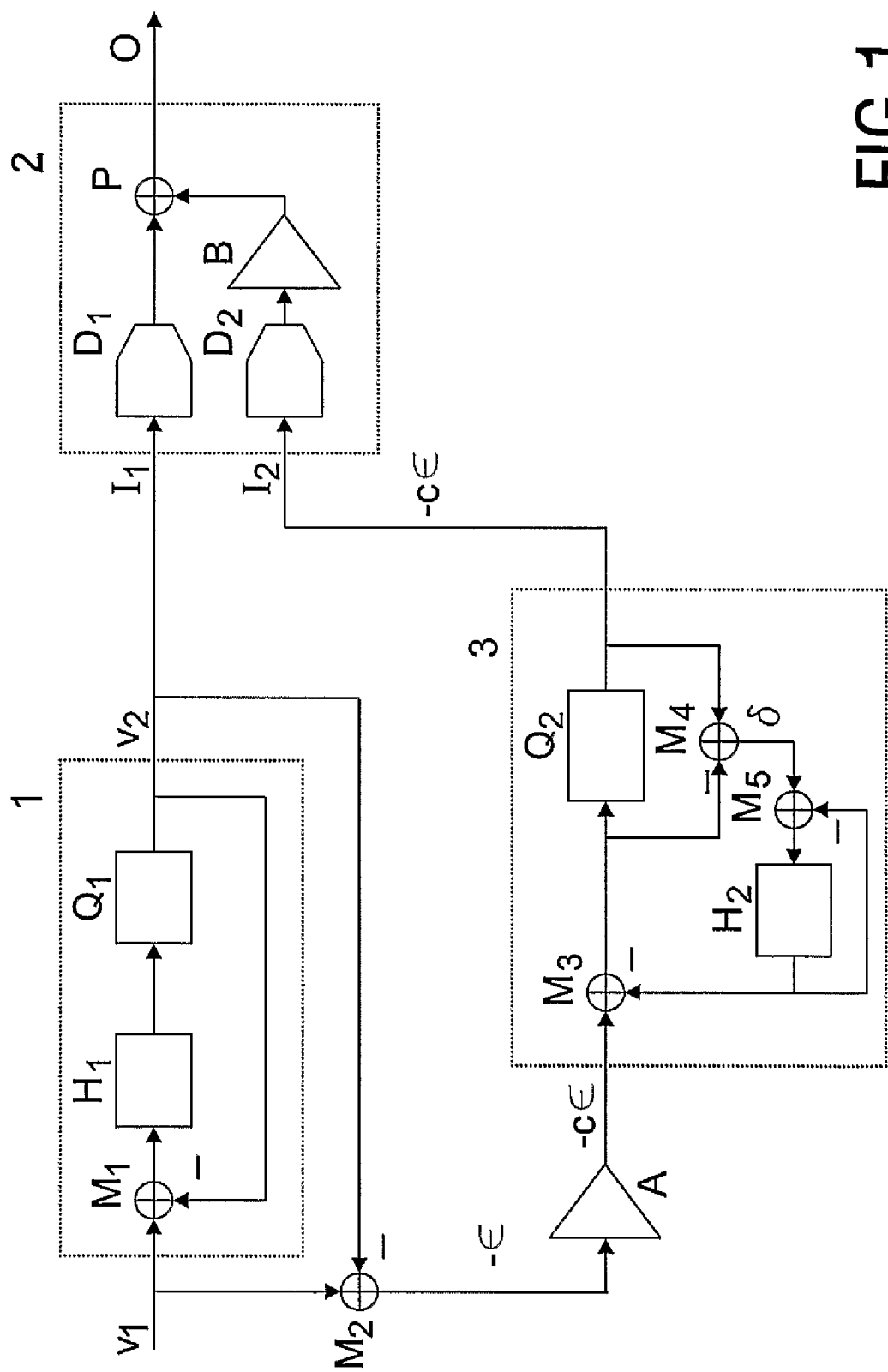

| | | | |
|---|---|---|---|
| 5,068,661 A * | 11/1991 | Kaneaki et al. | 341/143 |
| 5,369,403 A | 11/1994 | Temes et al. | |
| 5,724,038 A | 3/1998 | Koifman et al. | |
| 6,137,430 A * | 10/2000 | Lyden et al. | 341/145 |
| 6,255,977 B1 * | 7/2001 | Jelonnek et al. | 341/143 |
| 6,344,812 B1 * | 2/2002 | Takeda et al. | 341/143 |
| 6,724,332 B1 * | 4/2004 | Melanson | 341/143 |
| 6,861,968 B2 * | 3/2005 | Melanson et al. | 341/143 |
| 6,920,182 B2 * | 7/2005 | Bolton, Jr. | 375/247 |
| 7,158,063 B2 * | 1/2007 | Motz et al. | 341/143 |
| 2003/0179122 A1 * | 9/2003 | Yamamura | 341/150 |

FOREIGN PATENT DOCUMENTS

EP 0 660 532 6/1995

OTHER PUBLICATIONS

Xu X et al: "Dual-Truncation Digital-to-Analogue Convertors"; Electronics Letters, IEE Stevenage; GB vol. 28, No. 1; Jan. 1992; pp. 92-94.

* cited by examiner

DA-CONVERTER SYSTEM AND A METHOD FOR CONVERTING A MULTI-BIT DIGITAL SIGNAL TO AN ANALOG SIGNAL

This application is a 371 of PCT/IB05/50205 filed on Jan. 18, 2005.

The invention relates to a DA-converter system comprising a digital sigma-delta modulator for receiving a multi-bit digital input signal, for providing a reduced word-length digital output signal and for noise shaping the quantization noise generated thereby to a frequency band outside the frequency band of the digital input signal, said DA-converter system further comprising a digital to analog converting combiner with first and second digital inputs and an analog output and with the first digital input connected to the output of the digital sigma-delta modulator. Such DA-converter system is e.g. known from U.S. Pat. No. 5,724,038.

A usual system for converting a multi-bit digital signal to its analog equivalent is to firstly convert the low rate multi-bit digital input signal to a high rate single-bit digital signal by means of a sigma-delta modulator and to subsequently DA-convert the high rate single bit signal. The DA-converter can then for instance be a single switched current source, which is simple in construction and is free of non-linear distortion, because each bit is converted by the same current source. A drawback of such system is the large amount of quantization noise. The majority of the quantization noise is shaped to the higher frequencies outside the frequency band of the signal to be converted but can still cause distortions in many applications. A smaller part of the quantization noise resides in the lower frequency band of the converted signal and deteriorates the S/N-ratio of the converted signal. For these reasons it is nowadays preferred to use a sigma-delta modulator with a word-length m that is substantially smaller than the word-length of the input signal but that is larger than 1 bit. Such reduced but still multi-bit word-length will hereafter be referred to as a "few-bit" word-length. Present day DA-converter systems may e.g. use a few-bit word-length m of 5 bits. An m-bit quantizer reduces the quantization noise by approximately 6(m-1) dB. The output signal of the sigma-delta modulator then has to be converted by a DA-converter with more current sources, but present few-bit DA-converters are very well suitable to operate with excellent linearity among others by using modern dynamic element matching techniques. Therefore this few-bit word-length provides good S/N ratios in the low frequency band and also excellent linearity of the DA-conversion. A word-length higher than 5 or 6 would further reduce the quantization noise but the DA-converters for these word-lengths are difficult to implement with sufficient linearity, although a further reduction of the quantization noise would be welcomed. Especially in environments where small HF signals can occur, like in receiver sets for example, the quantization noise of a 5-bit converter can be can still be very disturbing. Standard solutions for this problem exist in applying a RC low-pass filter in the output of the DA-converter, which then needs to be integrated on board of the semiconductor chip that contains the DA-converter system. As the capacitor that is needed for this purpose is quite large, it takes large amounts of silicon area and, hence, is an expensive solution.

The present invention seeks to reduce the quantization noise in a DA-converter system that is substantially less expensive in silicon area without compromising the linearity of the conversion and the in-band S/N ratio and the DA-converter according to the present invention is therefore characterized by said sigma-delta modulator providing a reduced word-length multi-bit (few-bit) digital output signal and by a noise reduction arrangement for reducing the out-of-band quantization noise generated by the sigma-delta modulator, said noise reduction arrangement comprising means connected to the sigma-delta modulator for isolating the quantization noise generated thereby, a second noise shaper with substantially frequency independent signal transfer function receiving the isolated quantization noise and reducing the word-length of this quantization noise, and means to supply the reduced word-length quantization noise from the second noise shaper to the second digital input of the digital to analog converting combiner for generating an analog output signal with reduced out-of-band quantization noise at the combiner output.

It is noted that the abovementioned U.S. Pat. No. 5,724,038 also contains an arrangement for reducing quantization noise in a DA-converter system. However in this known system the in-band quantization noise is isolated by low pass filtering the output signal of the sigma-delta modulator and then subtracting the input signal there from. The isolated in-band quantization noise is subsequently applied to a second sigma-delta modulator with low pass signal transfer function and the output signals of the two sigma-delta modulators are combined to reduce the in-band quantization noise. The out-of-band quantization noise is not reduced. In contradistinction therewith the DA-converter system of the invention keeps the in-band quantization noise sufficiently small by using a few-bit sigma-delta modulator and the noise reduction arrangement is designed for reducing the out-of-band quantization noise.

In the DA-converter system of the present invention the DA-converting combiner may be designed to combine the digital output signals of the sigma-delta modulator and of the second noise shaper so that the out-of-band quantization noise at least partially cancels in the digital domain. Subsequently the combined digital signal has to be applied to a DA-converter for obtaining the analog output signal. A drawback of this arrangement however is that the combining operation increases the word-length so that a higher bit DA-converter is required. Therefore the DA-converter system of the present invention is preferably characterized in that the digital to analog converting combiner comprises a first DA-converter connected to the first input for converting the reduced word-length digital output signal of the sigma-delta modulator, a second DA-converter connected to the second input for converting the reduced word-length quantization noise from the second noise shaper and an analog combiner receiving the output signals of the first and second DA-converters and generating the analog output signal with reduced out-of-band quantization noise at the combiner output.

In accordance with another aspect of the invention the DA-converter system may be characterized in that the signal transfer function of the second noise shaper is approximately equal to unity and that the noise reduction arrangement comprises a digital amplifier for amplifying the isolated quantization noise with a predetermined factor prior to its application to the second noise shaper and that the digital to analog converting combiner comprises an attenuator for attenuating the reduced word-length quantization noise derived from the second noise shaper with substantially the same predetermined factor. Because the isolated quantization noise of the sigma-delta modulator is at the scale of the least significant bit of the quantizer of this sigma-delta modulator, the amplitude of the quantization noise is substantially lower than the dynamic range of this modulator.

Further, because in practice the second noise shaper will have approximately the same dynamic range as the sigma-delta modulator the isolated quantization noise can be amplified before entering the second noise shaper, thus making full use of the dynamic range thereof. Then the output of the second noise shaper can be and has to be reduced by the same factor before it is combined with the output of the sigma-delta modulator, with the result that the HF noise generated by the second noise shaper itself is reduced by the same factor. As a further advantage the signal to noise requirements of the second noise shaper can be lower compared to that of the sigma-delta modulator, so that the second noise shaper can be significantly smaller in silicon area than the sigma-delta modulator. As a further characteristic of the invention the attenuator is an analog attenuator arranged between the output of the second DA-converter and the analog combiner, so that the attenuator does not increase the word-length of the signal applied to the second DA-converter.

It may be observed that the above described arrangement with amplifier and attenuator may be modified by using a second noise shaper with built-in signal amplification and/or using a second DA-converter with built-in signal attenuation.

In the DA-converter system of the invention the output code of the second noise shaper needs to follow its input code as close as possible, with the only restriction that it may not produce low frequency quantization noise. While a topology, which has a unity signal transfer function in a linearized approximation, is already close to this, a further optimization may be obtained when, according to a further aspect of the invention, means are provided to reduce the difference between the input signal and the output signal of the second noise shaper when this difference is larger than one least significant bit of the output signal.

Furthermore it is of importance that the gain factor of the digital amplifier matches as good as possible with the attenuation factor of the attenuator. When the attenuator is in the analog domain of the DA-converter system the attenuator factor will never equal the gain factor precisely. To improve the matching between these two factors the DA-converter system of the invention may be still further characterized by calibrating means for supplying, during a calibration mode, a calibration signal to the first digital input of the digital to analog converting combiner and through the digital amplifier and a short-circuit bypass of the second noise shaper to the second input of the digital to analog converting combiner, for measuring the resulting analog calibration signal at the combiner output and for setting the gain of the digital amplifier and/or of the attenuator to minimize said resulting analog calibration signal at the combiner output. The complexity of these calibrating means may be lowered when the sigma-delta modulator, which receives a zero input signal during the calibration mode, generates the calibration signal. Then use is made of the fact that a sigma-delta modulator delivers an alternating digital signal even when the input signal of the modulator is zero.

The invention also relates to a method of converting a multi-bit digital signal to an analog output signal, said method comprising the steps of reducing the word-length of the digital input signal by means of a digital sigma-delta modulator, thereby shaping the generated quantization noise to a frequency band higher than the baseband of the digital input signal and applying the reduced word-length digital output signal of the sigma-delta modulator to a first digital input of a digital to analog converting combiner for generating the analog output signal, said method being characterized by isolating the quantization noise from the sigma-delta modulator by subtracting the input signal and the output signal of the sigma-delta modulator from each other, reducing the word-length of the isolated quantization noise by means of a second noise shaper with substantially frequency independent signal transfer function and applying the reduced word-length quantization noise to a second digital input of the digital to analog converting combiner for the generation of the analog output signal with reduced out-of-band quantization noise at an analog output of the combiner.

The invention will be described with reference to the accompanying drawings.

Figure 2:
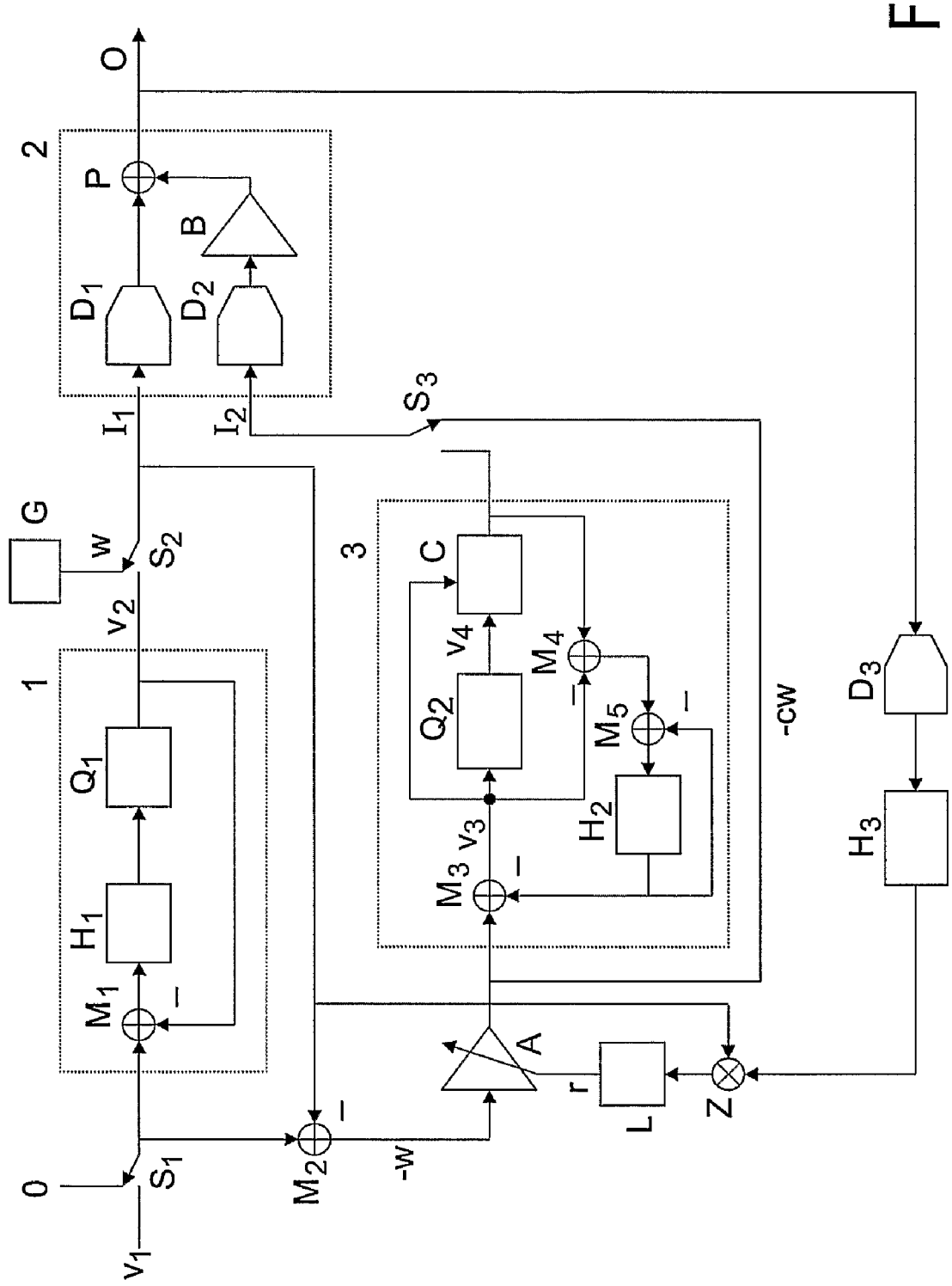

Herein shows:

FIG. 1 a first embodiment of a DA-converting system according to the invention and FIG. 2 a second embodiment of a DA-converting system according to the invention.

The DA-conversion system of FIG. 1 comprises a sigma-delta modulator 1 to which a multi-bit digital input signal $v_1$ is applied. By way of example the input signal may originate from a digital audio signal having a word-length of 24 bits and a sampling rate of 44,1 KHz. Prior to its application to the sigma-delta modulator the sampling rate of the input signal may be considerably increased to e.g. 128×44.1 KHz in an interpolator (not shown in the figure).

The sigma-delta modulator 1 comprises a digital low pass filter $H_1$ whose output is connected to the input of a few-bit quantizer $Q_1$. The output signal $v_2$ of the quantizer is subtracted from the input signal $v_1$ in a subtracter M1 and the result $v_1-v_2$ is applied to the input of the low pass filter $H_1$. The output signal $v_2$ is also fed through a first input $I_1$ of a digital to analog converting combiner 2 to a first DA-converter $D_1$. The analog output of this DA-converter is applied through an analog adder P to the analog output O of the system.

The main function of the sigma-delta modulator 1 is to reduce the 24-bit word-length of the input signal $v_1$ to a substantially lower few-bit word-length. For instance the quantizer $Q_1$ is a 5-bit quantizer, so that the of the output signal $v_2$ has a word-length of 5 bit.

This process generates quantization noise which is larger the lesser the number of bits of the quantizer is. The low pass filter $H_1$, which may for instance be of fifth order, determines the extent to which the quantization noise is shaped to the high frequency band above the frequency band of interest occupied by the input signal. Therefore the output signal $v_2$ comprises a low frequency (in-band) signal that is to a large extend equal to the input signal $v_1$ and high frequency (out-of-band) quantization noise $\epsilon$.

The system of FIG. 1 further comprises a subtracter $M_2$ in which the output signal $v_1$ is subtracted from the input signal $v_1$ so that in the output signal $v_2-v_2$ of this subtracter the in-band signal components are cancelled against each other and only the isolated out-of-band quantization noise remains with negative polarity $V_1-V_2 \sim -\epsilon$. It may be noted that the same result is obtained when the output signal of the subtracter $M_1$ is derived for the purpose of isolating the quantization noise and that substantially the same result is obtained when the difference between the input signal and the output signal of the quantizer $Q_1$ is derived for that purpose. The isolated quantization noise–$\epsilon$of the sigma-delta modulator 1 is amplified by a factor c in a digital amplifier A and subsequently fed to a second noise shaper 3. This second noise shaper comprises a third subtracter $M_3$ followed by a second quantizer $Q_2$. Output and input signals of the second quantizer $Q_2$ are subtracted from each other in a fourth subtracter $M_4$, the difference signal $\delta$ is applied through a fifth subtracter $M_5$ to a low pass filter $H_2$ and the output signal of this low pass filter is applied to the subtracting inputs of the subtracters $M_3$ and $M_5$.

It is the purpose of the second noise shaper 3 to reduce the word-length of the amplified quantization noise -c$\epsilon$ of the first quantizer $Q_1$. Because this amplified quantization noise is a high frequency signal, a sigma-delta modulator such as the sigma-delta modulator 1, which has a low pass signal transfer function, cannot be used for this noise shaping. Therefore the second noise shaper 3 has a unity signal transfer function. The few-bit output signal of the second noise shaper -c$\epsilon$ is applied, through a second input $I_2$ of the digital to analog converting combiner 2, to a second DA-converter $D_2$ and through an attenuator B with attenuation factor 1/c' to a second input of the adder P. When the amplification factor c and the reverse c' of the attenuation factor are equal, then the high frequency quantization noise $\epsilon$ of the quantizer $Q_1$ is substantially cancelled.

The subtracters $M_4$ and $M_5$ of the second noise shaper and the low pass filter $H_2$ serve to feedback the quantization noise $\epsilon$ generated by the quantizer $Q_2$ and to thereby shape this noise to the higher frequencies. If the low pass filters $H_1$ and $H_2$ have the same transfer function H(z), the noise transfer function of the second noise shaper 3 is equal to the noise transfer function of the sigma-delta modulator 1, namely 1/(H(z)+1). In contradistinction, the signal transfer function of the sigma-delta modulator is H(z)/(H(z)+1) while the signal transfer function of the second noise shaper is 1. It is of importance that the noise $\delta$ of the second quantizer is shaped to the higher frequencies because otherwise this noise would distort the desired low frequency signal in the adder P.

Usually the maximum level of the input signal $v_1$ is adapted to the dynamic range of the sigma-delta modulator. The level of the quantization noise $\epsilon$ of this modulator is substantially lower than the maximum level of the input signal, especially when a quantizer of e.g. 5 bits is used. This also means that the level of the quantization noise $\epsilon$ is substantially lower than the dynamic range of the second noise shaper, provided that the dynamic ranges of the sigma-delta modulator and the second noise shaper are substantially equal. Therefore the quantization noise $\epsilon$ can be amplified by the gain c before entering the second noise shaper 3, thus making full use of the dynamic range of the second noise shaper. The output signal of the second noise shaper can then be reduced by the same factor c before it is combined with the output of the sigma-delta modulator in the adder P, with the result that the quantization noise $\epsilon$ generated by the second noise shaper is reduced by the same factor and that the signal to noise ratio of the second noise shaper can be substantially lower. This has the advantage that the second noise shaper can be implemented in considerably smaller silicon area than the sigma-delta modulator.

The attenuator B might be inserted between the output of the second noise shaper 3 and the second DA-converter $D_2$. However this would mean that the attenuator is in the digital domain and this would increase the word-length of the signal to be converted in the DA-converter. To avoid this the attenuator B is preferably an analog attenuator in the output of the DA-converter $D_2$.

For a good noise cancellation it is of importance that the level of the isolated quantization noise applied by the subtracter $M_2$ through the amplifier A, the noise shaper 3, the DA-converter $D_2$ and the attenuator B to the adder P is as good as possible equal (and opposite) to the quantization noise supplied with the desired signal through the DA-converter $D_1$ to the adder P. The arrangement shown in FIG. 2 provides two measures to improve this equality. One measure is to make the signal transfer function of the noise shaper 3 more equal to unity and the second measure is to make the signal transfer through the amplifier A and the attenuator B with bypassed noise shaper 3 to be more equal to unity.

The first measure consists of introducing a coder C in the output lead of the noise shaper 3. This coder firstly truncates the input signal $V_3$ of the noise shaper 3 to a few-bit digital signal $V'_3$ and then to modify the output signal $V_4$ of the noise shaper according to the following algorithm:

If $(V_4>V'_3)$ then $v_4:=V'_3+1$ else if $(V_4<V'3)$ then $v_4:=V'_3-1$

Herein 1 is the value of the least significant bit of the two few bit signals $V_3$' and $v_4$. This algorithm avoids that the difference between $v_4$ and $V'_3$ can become larger than one least significant bit. Although this algorithm reduces the stability of the second noise shaper somewhat, it results in a few dB additional suppression of the quantization noise. The algorithm can be implemented in a dedicated circuit or by a software procedure in a multi purpose signal processor.

The second measure depicted in FIG. 2 consists in the addition of a calibration circuit. This calibration circuit comprises a first switch $S_1$ in the input lead to the sigma-delta modulator 1, a second switch $S_2$ in the output lead of the sigma-delta modulator to the first input $I_1$ of the DA-converting combiner 2 and a third switch $S_3$ between the output of the second noise shaper 3 and the second input $I_2$ of the DA-converting combiner 2. The three two-position switches $S_1$, $S_2$ and $S_3$ are shown in the position that they have during a calibration mode. This mode may e.g. exist during a short time at the start up of the arrangement. During normal operation the switches are in the other position.

During the calibration mode the first input $I_1$ of the DA-converting combiner receives from a generator G a two-valued alternating digital calibration signal w through the switch $S_2$. This signal w is converted to an analog signal in the DA-converter $D_1$ and the analog version of the signal w is subsequently applied to the first input of the adder P. The calibration signal w is also applied to the subtracting input of the subtracter $M_2$ whose other input receives a zero-signal through the switch $S_1$. Therefore the output of the subtracter is -w. This signal -w is amplified with the gain c of amplifier A so that during the calibration mode the amplifier A outputs the signal -cw. This signal is applied, through the switch $S_3$, to the second input of the DA-converting combiner 2, converted to analog by the DA-converter $D_2$ and attenuated by the factor c' in the attenuator B. The resulting analog signal -wc/c' is applied to the second input of the adder P. In this adder the two calibration signals w and -wc/c' are added. The calibration signal at the output O of the adder P is zero when the gain c of the amplifier A perfectly matches the attenuation 1/c' of the attenuator B. A lower gain c results in a larger calibration output signal that is in phase with the signal w and a higher gain c results in a larger calibration output signal with reversed phase.

The calibration output signal is applied to a control chain for controlling the gain of the amplifier A. This chain comprises an AD-converter $D_3$, a digital high pass filter $H_3$, a digital multiplier Z and a latch L. The AD-converter serves to digitize the analog calibration output signal, the high pass filter $H_3$ represses any DC-offset of the AD-converter $D_3$ and of any analog amplifier(s) in front of the AD-converter and the multiplier Z multiplies the alternating calibration output signal with the alternating signal w to obtain a digital DC control signal r. This control signal r is applied through a latch L to the amplifier A. Therefore the gain of the amplifier A is controlled so that any mismatch between the gain of the amplifier and the attenuation of the attenuator B is substantially minimized. The latch L is included to ascertain that the amplifier gain, set during the calibration mode, is maintained during the normal operation of the DA-converter system.

If the calibration signal is rather low frequent, the AD converter D3 can have a relatively low bandwidth, resulting in a smaller chip area for its implementation. The degree of accuracy to which the out of band quantization noise can be suppressed, is determined by the smallest of the word-lengths of the quantizer Q1 and the AD converter D3. Therefore, with a quantizer Q1 of 5 bits, the word-length of the AD converter should preferably be not less than 5 bits.

The arrangement depicted in FIG. 2 can be simplified by using the sigma-delta modulator with zero input signal as the source of the calibration signal. Then the generator G for the signal w and the switch S2 can be deleted. The main problem, however, is that the signal generated by the sigma-delta modulator is not predictable but random and that it has significant HF components, due to which the AD converter needs to have considerable bandwidth.

The invention claimed is:

1. A DA-converter system comprising:
    a digital sigma-delta modulator (1) for receiving a multi-bit digital input signal ($v_1$), for providing a reduced word-length digital output signal ($v_2$) and for noise shaping the quantization noise generated thereby to a frequency band outside the frequency band of the digital input signal,
    said DA-converter system further comprising,
    a digital to analog converting combiner (2) with first and second digital inputs ($I_1$, $I_2$) and an analog output (O) and with the first digital input ($I_1$) connected to the output of the digital sigma-delta modulator, characterized by said sigma-delta modulator providing a reduced word-length multi-bit digital output signal and by a noise reduction arrangement for reducing the out-of-band quantization noise generated by the sigma-delta modulator, said noise reduction arrangement comprising means ($M_2$) connected to the sigma-delta modulator for isolating the quantization noise generated thereby, a second noise shaper (3) with substantially frequency independent signal transfer function receiving the isolated quantization noise and reducing the word-length of this quantization noise, and means to supply the reduced word-length quantization noise from the second noise shaper (3) to the second digital input ($I_2$) of the digital to analog converting combiner for generating an analog output signal with reduced out-of-band quantization noise at the combiner output (O).

2. A DA-converter system as claimed in claim 1 characterized in that the digital to analog converting combiner (2) comprises a first DA-converter ($D_1$) connected to the first input ($I_1$) for converting the reduced word-length digital output signal ($v_2$) of the sigma-delta modulator, a second DA-converter ($D_2$) connected to the second input ($I_2$) for converting the reduced word-length quantization noise from the second noise shaper (3) and an analog combiner (P) receiving the output signals of the first and second DA-converters and generating the analog output signal with reduced out-of-band quantization noise at the combiner output (O).

3. A DA-converter system as claimed in claim 1 characterized in that the signal transfer function of the second noise shaper (3) is approximately equal to unity and that the noise reduction arrangement comprises a digital amplifier (A) for amplifying the isolated quantization noise with a predetermined factor prior to its application to the second noise shaper (3) and that the digital to analog converting combiner comprises an attenuator (B) for attenuating the reduced word-length quantization noise derived from the second noise shaper (3) with substantially the same predetermined factor.

4. A DA-converter system as claimed in claim 3 characterized in that the attenuator (B) is an analog attenuator arranged between the output of the second DA-converter ($D_2$) and the analog combiner (P).

5. A DA-converter system as claimed in claim 3 characterized in that means (C) are provided to reduce the difference between the input signal and the output signal of the second noise shaper (3) when this difference is larger than one least significant bit of the output signal.

6. A DA-converter system as claimed in claim 3 characterized by calibrating means for supplying, during a calibration mode, a calibration signal (w) to the first digital input ($I_1$) of the digital to analog converting combiner (2) and through the digital amplifier (A) and a short-circuit bypass of the second noise shaper (3) to the second input ($I_2$) of the digital to analog converting combiner (2), for measuring the resulting analog calibration signal at the combiner output (O) and for setting the gain of the digital amplifier (A) and/or of the attenuator (B) to minimize said resulting analog calibration signal at the combiner output (O).

7. A DA-converter system as claimed in claim 6 characterized in that the sigma-delta modulator (1), which receives a zero input signal during the calibration mode, generates the calibration signal.

8. A method of converting a multi-bit digital signal to an analog output signal, comprising the steps of comprising the steps of:
    reducing the word-length of the digital input signal by means of a digital sigma-delta modulator (1), thereby shaping the generated quantization noise to a frequency band higher than the baseband of the digital input signal and
    applying the reduced word-length digital output signal of the sigma-delta modulator to a first digital input ($I_1$) of a digital to analog converting combiner (2) for generating the analog output signal, characterized by
    isolating the quantization noise ($\epsilon$) from the sigma-delta modulator by subtracting the input signal and the output signal of the sigma-delta modulator from each other,
    reducing the word-length of the isolated quantization noise by means of a second noise shaper (3) with substantially frequency independent signal transfer function and applying the reduced word-length quantization noise to a second digital input ($I_2$) of the digital to analog converting combiner for the generation of the analog output signal with reduced out-of-band quantization noise at an analog output (O) of the combiner.

* * * * *